(12) United States Patent
Zenz et al.

(10) Patent No.: US 9,424,507 B2
(45) Date of Patent: Aug. 23, 2016

(54) DUAL INTERFACE IC CARD COMPONENTS AND METHOD FOR MANUFACTURING THE DUAL-INTERFACE IC CARD COMPONENTS

(71) Applicant: NXP B.V., Eindhoven (NL)

(72) Inventors: Christian Zenz, Graz (AT); Tonny Kamphuis, Lent (NL); Johannes Wilhelmus van Rijckevorsel, Ledeacker (NL); Bodin Kasemset, Bangkok (TH); David Ceccarelli, Hitzendorf (AT); Boudewijn van Blokland, Nijmegen (NL); Patrick Schoengrundner, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/242,031

(22) Filed: Apr. 1, 2014

(65) Prior Publication Data

US 2015/0278673 A1  Oct. 1, 2015

(51) Int. Cl.
*G06K 19/06* (2006.01)
*G06K 19/077* (2006.01)

(52) U.S. Cl.
CPC .... *G06K 19/07754* (2013.01); *G06K 19/07745* (2013.01); *G06K 19/07769* (2013.01); *Y10T 29/49018* (2015.01)

(58) Field of Classification Search
USPC ............ 235/492, 451, 488; 340/572.7, 572.8
See application file for complete search history.

(56) References Cited

U.S. PATENT DOCUMENTS

| | | |
|---|---|---|
| 2003/0052177 A1 | 3/2003 | Halope |
| 2007/0144662 A1 | 6/2007 | Armijo et al. |
| 2008/0283615 A1 | 11/2008 | Finn |
| 2009/0095818 A1* | 4/2009 | Smith et al. ................... 235/492 |
| 2009/0184166 A1 | 7/2009 | Bhandarkar et al. |
| 2012/0193436 A1 | 8/2012 | Sutera |
| 2013/0026238 A1 | 1/2013 | Benato |
| 2013/0140370 A1* | 6/2013 | Finn .............................. 235/492 |

FOREIGN PATENT DOCUMENTS

EP  2626814 A1  8/2013

\* cited by examiner

*Primary Examiner* — Ahshik Kim

(57) ABSTRACT

Dual-interface Integrated Circuit (IC) card components and methods for manufacturing the dual-interface IC card components are described. In an embodiment, a dual-interface IC card component includes a single-sided contact base structure, which includes a substrate with an electrical contact layer. On the single-sided contact base structure, one or more antenna contact leads are attached to the single-sided contact base structure to form a dual-interface contact structure, which is a component of a dual-interface IC card. Other embodiments are also described.

20 Claims, 8 Drawing Sheets

DUAL INTERFACE IC CARD COMPONENTS AND METHOD FOR MANUFACTURING THE DUAL-INTERFACE IC CARD COMPONENTS

Embodiments of the invention relate generally to electronic circuits and, more particularly, to integrated circuit (IC) devices and methods for manufacturing IC devices.

An IC card, such as a smart card, includes an embedded integrated circuit that can be used to store information and perform data processing. For example, a portable IC card can be used in financial, transportation, security, healthcare, or other applications to provide identification and authentication. Types of IC cards include contact IC cards that communicate via electrical contacts, contactless IC cards that communicate wirelessly through antennas, and dual-interface IC cards that communicate via electrical contacts and wirelessly through antennas. Compared to contact IC cards and contactless IC cards, dual-interface IC cards allow users to switch between contact card readers and contactless card readers. However, since dual-interface IC cards include both electrical contacts and antennas, the dual-interface IC cards are more expensive to manufacture than contact IC cards and contactless IC cards. Therefore, there is a need for low-cost dual-interface IC card components and manufacturing dual-interface IC card components in a cost-effective manner.

Dual-interface Integrated Circuit (IC) card components and methods for manufacturing the dual-interface IC card components are described. In an embodiment, a dual-interface IC card component includes a single-sided contact base structure, which includes a substrate with an electrical contact layer. On the single-sided contact base structure, one or more antenna contact leads are attached to the single-sided contact base structure to form a dual-interface contact structure, which is a component of a dual-interface IC card. The dual-interface contact structure is more cost-effective than using a prefabricated dual-interface contact tape currently available in the marketplace, which is typically made from scratch using etching or stamping technology. Other embodiments are also described.

In an embodiment, a method for manufacturing a dual-interface IC card component involves obtaining a single-sided contact base structure, where the single-sided contact base structure includes a substrate with an electrical contact layer, and attaching at least one antenna contact lead to the single-sided contact base structure to form a dual-interface contact structure, which is a component of a dual-interface IC card.

In an embodiment, a method for manufacturing a dual-interface IC card component involves obtaining a single-sided contact tape that contains at least one column of single-sided base structures, where the single-sided contact tape includes a substrate with an electrical contact layer, applying an adhesive material to the substrate of the single-sided contact tape, obtaining antenna contact leads from a sheet of conductive material, and attaching the antenna contact leads to the single-sided contact tape using the applied adhesive material to form dual-interface contact structures.

In an embodiment, a dual-interface IC card component includes a substrate, an electrical contact layer attached to a first side of the substrate, and at least one antenna contact lead glued to a second, opposite, side of the substrate. The electrical contact layer includes a contact plate and multiple grooves.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
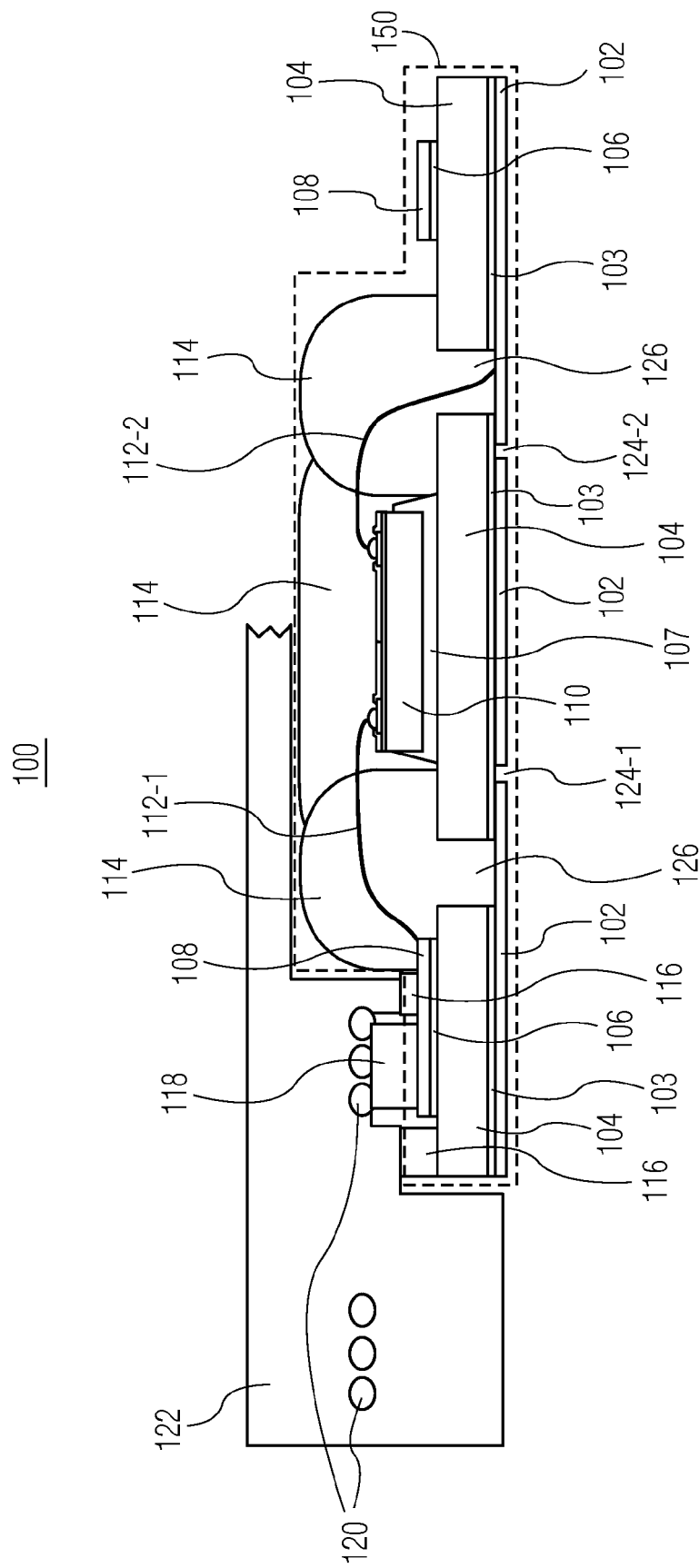
FIG. 1 is a cross-sectional view of a dual-interface IC card in accordance with an embodiment of the invention.

FIG. 1 is a cross-sectional view of a dual-interface IC card 100 in accordance with an embodiment of the invention. The dual-interface IC card can be used in financial, transportation, security, healthcare, or other applications to store information and perform data processing. In some embodiments, the dual-interface IC card has the ability to securely manage, store and provide access to data on the card, perform on-card functions, such as encryption, authentication, and authorization, and interact intelligently with a card reader. The dual-interface IC card can communicate by electrical contacts or wirelessly through an antenna. In an embodiment, the dual-interface IC card is a smart card, which can be used in Near field communication (NFC) applications. In some embodiments, the IC card is a smart card that is designed to be compatible with the International Organization for Standardization (ISO)/the International Electrotechnical Commission (IEC) 14443. As described in more detail below, the manufacturing cost of the dual-interface IC card can be significantly lower than conventional dual-interface IC cards because the dual-interface IC card can be produced using a prefabricated single-sided contact base structure that is used to make a module for a contact smart card (e.g., a standard single-sided contact tape currently available in the marketplace), rather than a more expensive prefabricated double-sided contact base structure that is used to make a module for a dual-interface smart card (e.g., a standard double-sided contact tape currently available in the market).

In the embodiment depicted in FIG. 1, the dual-interface IC card 100 includes a contact layer 102, a substrate 104, an adhesive layer 106, antenna contact leads 108, an IC chip 110, bond wires 112, an encapsulation 114, adhesives 116, an electrical connection layer 118, an antenna layer 120, and a card body 122. Although the dual-interface IC card is shown in FIG. 1 as including certain components, in other embodiments, the dual-interface IC card may include fewer components or additional components that are commonly found in conventional dual-interface smart cards.

The contact layer 102 of the dual-interface IC card 100 is used to make electrical contacts with a card reader to communicate with the card reader. In some embodiments, the contact layer is located at the front side of the dual-interface IC card while the card body 122 is located at the back side of the dual-interface IC card. The contact layer may be made of metal or other conductive material. In some embodiments, the contact layer is made of Gold (Au)-Nickel (Ni) plated Copper (Cu) foil or galvano deposited Cu. The contact layer, which is also referred to as the contact pad, provides electrical connectivity when the dual-interface IC card is inserted into a card reader. In some embodiments, the contact layer is designed and produced to be compatible with the International Organization for Standardization (ISO) 7816. The contact layer typically includes groove/recess lines used to electrically insulate contact areas of the contact layer from each other and make the contact layer more flexible. In the embodiment depicted in FIG. 1, the contact layer has two groove lines 124-1, 124-2. However, in other embodiments, the contact layer may have any number of groove lines.

The substrate 104 is used to support other elements of the dual-interface IC card 100, such as the contact layer 102, the antenna contact leads 108 and the IC chip 110. The substrate may be made of any suitable substrate material. As an example, the substrate may be made of Epoxy glass, fiberglass, or plastic substrates (Polyethylene naphthalate (PEN), etc.). In the embodiment depicted in FIG. 1, bonding holes 126 are present on the substrate to enable wire bonding of the IC chip 100 to the contact layer, which are located on opposite sides of the substrate. The substrate may be in the form of a sheet or a tape. In some embodiments, the contact layer and the substrate form a single-sided contact base structure, which may be packaged into a single-sided contact tape. For example, a device manufacturer may produce a prefabricated single-sided contact base structure that includes the contact layer and the substrate in mass quantities. In some embodiments, an optional adhesive layer 103 is located between the contact layer and the substrate.

The adhesive layer 106 of the dual-interface IC card 100 is used to attach the antenna contact leads 108 onto the substrate 104. The adhesive layer 106 may be made of any suitable adhesive material. In some embodiments, the adhesive layer 106 is made of glue. The adhesive layer can be formed by applying an adhesive material (e.g., glue) on the substrate and/or the antenna contact leads by various processes. For example, the adhesive material may be dispense on the substrate or pre-applied on the antenna contact leads. A curing process (e.g., oven curing) may then be performed to cure the adhesive material.

The antenna contact leads 108 of the dual-interface IC card 100 are used to provide electrical contacts between an antenna (e.g., the antenna layer 120) and the IC chip 110. The antenna contact leads may be made of any suitable conductive material. For example, the antenna contact leads may be made of a metal foil or a metal laminate, which includes a metal foil and a substrate. In some embodiments, the antenna contact leads are made of gold and nickel (Au—Ni) plated copper (Cu) or silver (Ag) plated stainless steel. The antenna contact leads may be made in any suitable dimensions. In some embodiments, the antenna contact leads have a uniform thickness. For example, the thickness of the antenna contact leads may be in the range of between 10 micrometers (μm) and 100 μm, which overlaps with the standard thickness for antenna contact leads (e.g., between 18 μm and 35 μm for Cu foil) of smart cards. The antenna contact leads can be produced by any suitable process, including (without being limited to), punching, etching and laser cutting a sheet of conductive material. In some embodiments, the antenna contact leads are produced by punching either a standalone conductive sheet or a conductive sheet in a reel-to-reel format. In some embodiments, the antenna contact leads are produced by depositing a metal layer on a plastic substrate material. In some embodiments, the antenna contact leads are plated with suitable material, such as Ni, Au and/or Ag, for better antenna attachment or for better wire bond attachment. The antenna contact leads may be made of any suitable shape or dimension. In some embodiments, the antenna contact leads are designed and produced with features to ease the interconnection process with the substrate 104. For example, one or more antenna contact leads may have a spring like feature or may be crimped to improve adhesion of the conductive material (e.g., glue etc.) used in the interconnection process. The antenna contact leads can be attached to the substrate 104 by a pick-and-place process in which one or more antenna contact leads are picked up and placed on the substrate. Alternatively, the antenna contact leads can be attached to the substrate in a reel-to-reel process in which adhesive is applied to the antenna contact leads on a first reel, which is then applied onto a second reel, i.e., the single-sided contact tape, similar to the process of attaching a sheet of paper labels onto products. In some embodiments, instead of contact leads, a primary antenna structure is applied to the substrate 104 by a pick-and-place process in which the primary antenna structure is picked up and placed on the substrate. Although the antenna contact leads are shown in FIG. 1 as being electrically connected to the antenna layer 120 through the electrical connection layer 118, in other embodiments, the antenna contact leads may be in direct contact with the antenna layer. In addition, in other embodiments, the antenna contact leads are either connected to an antenna located on the substrate 104 or connected to a small antenna directly placed on the substrate, to be compliant with ISO/IEC 14443 requirements. In these embodiments, the antenna layer 120 acts as a "booster" antenna, which is electromagnetically coupled to the antenna located on the substrate.

In some embodiments, the contact layer 102, the substrate 104, the adhesive layer 106, and the antenna contact leads 108 form a dual-interface contact structure, which may be produced in mass quantities. For example, a device manufacturer can produce dual-interface contact structures in mass quantities based on prefabricated single-sided contact base structures, such as prefabricated single-sided contact tapes provided by Linxens, Interplex, Kinsus, LG Innotek and Possehl.

The IC chip 110 of the dual-interface IC card 100 includes circuitry to securely manage, store and provide access to data on the card and/or perform on-card functions, such as encryption, authentication, and authorization. The IC chip is designed to communicate with another device (e.g., a card reader) by electrical contacts or wirelessly through an antenna. In the embodiment depicted in FIG. 1, the dual-interface IC card includes a single IC chip with both contact and contactless interfaces, which makes is possible to access the IC chip 110 using either a contact interface (e.g., the contact layer 102) or a contactless interface (e.g., the antenna layer 120) with a high level of security. Alternatively, the dual-interface IC card may include two IC chips, including one IC chip with a contact interface and another, separated, IC chip with a contactless interface. The IC chip may be attached to the substrate 104 using any appropriate method. As an example, in some embodiments, the IC chip is glued onto the substrate using an adhesive layer 107.

The bond wires 112-1, 112-2 of the dual-interface IC card 100 are used to electrically connect the IC chip 110 to the contact layer 102 and to the antenna layer 120. The bond wires may be made of any suitable metal (e.g., aluminum or copper). In the embodiment depicted in FIG. 1, the bond wire 112-1 electrically connects the IC chip to the antenna contact leads 108, which is electrically connected to the antenna layer 120, while the bond wire 112-2 electrically connects the IC chip to the contact layer. Bond pads may be used to attach the bond wires to the IC chip, the antenna contact leads, and/or the contact layer. In other embodiments, the connections between the bond wires and the contact layer or antenna contact leads may be different from the connections shown in FIG. 1.

The encapsulation 114 of the dual-interface IC card 100 is used to protect the bond wires 112 and the IC chip 110. The encapsulation may be made of a suitable material, such as epoxy, in a process such as glob-top or molding In some embodiments, the contact layer 102, the substrate 104, the adhesive layer 106, the antenna contact leads 108, the IC chip 110, the bond wires 112, and the encapsulation 114 form a dual-interface IC chip module 150. A device manufacturer may produce dual-interface IC chip modules in mass quantities. For example, a device manufacturer may produce dual-interface IC chip modules in mass quantities based on dual-interface contact structures. Each dual-interface contact structure includes the contact layer, the substrate, the adhesive layer, and the antenna contact leads.

Figure 2:
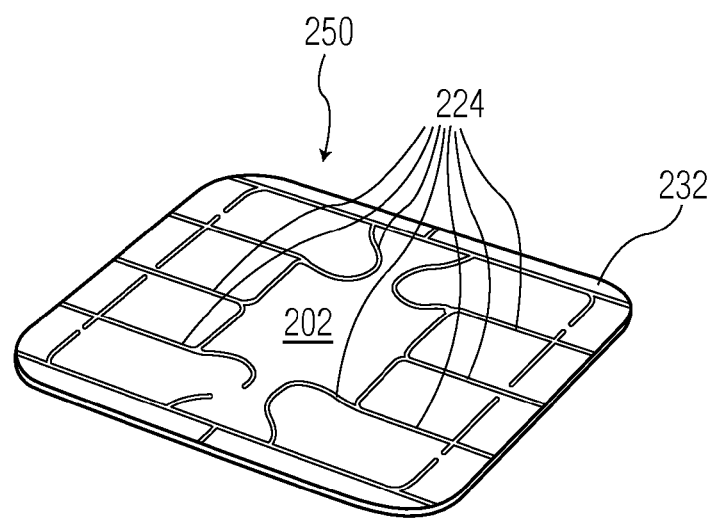
FIG. 2 depicts a front-side view of an embodiment of a dual-interface IC chip module of the dual-interface IC card depicted in FIG. 1.

FIG. 2 depicts a front-side view of an embodiment of the dual-interface IC chip module 150 depicted in FIG. 1. In the embodiment depicted in FIG. 2, a front-side view of a dual-interface IC chip module 250 shows a contact layer 202, which includes a contact plate 232 and groove lines 224. The contact layer 202 depicted in FIG. 2 is one possible embodiment of the contact layer 102 depicted in FIG. 1. However, the contact layer 102 depicted in FIG. 1 is not limited to the embodiment shown in FIG. 2. For example, the contact layer 102 depicted in FIG. 1 may have groove/recess lines that are different from the groove lines 224 shown in FIG. 2.

Figure 3:
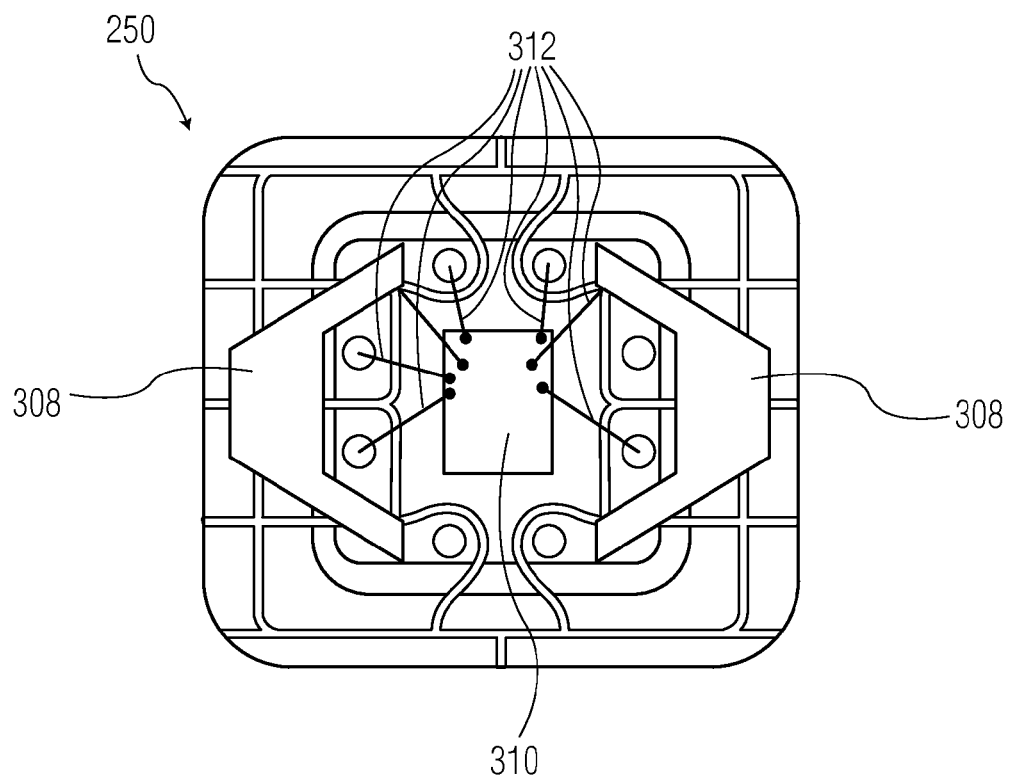
FIG. 3 depicts a back-side view of the dual-interface IC chip module depicted in FIG. 2.

FIG. 3 depicts a back-side view of the dual-interface IC chip module 250 depicted in FIG. 2. In the embodiment depicted in FIG. 3, a back-side view of the dual-interface IC chip module shows an IC chip 310, bond wires 312, and A-shaped antenna contact leads 308. The embodiment of the antenna contact leads 308 depicted in FIG. 3 is a possible embodiment of the antenna contact leads 108 depicted in FIG. 1. However, the antenna contact leads 108 depicted in FIG. 1 are not limited to the embodiment shown in FIG. 3. For example, the antenna contact leads 108 depicted in FIG. 1 can be implemented in a shape that is different from the antenna contact leads shown in FIG. 3.

A process of manufacturing the dual-interface IC chip module 150 depicted in FIG. 1 in accordance with an embodiment of the invention is described with reference to FIGS. 4-12. Compared with a conventional manufacturing process in which a dual-interface IC chip module is made using a relatively expensive double-sided contact tape as a base structure, the manufacturing process produces the dual-interface IC chip module 150 using a cost-effective prefabricated single-sided contact base structure, e.g., a single-sided contact tape, and antenna contact leads that are attached to the single-sided contact base structure. By using the prefabricated single-sided contact base structure, the cost of the dual-interface IC chip module is significantly reduced.

Figure 4:
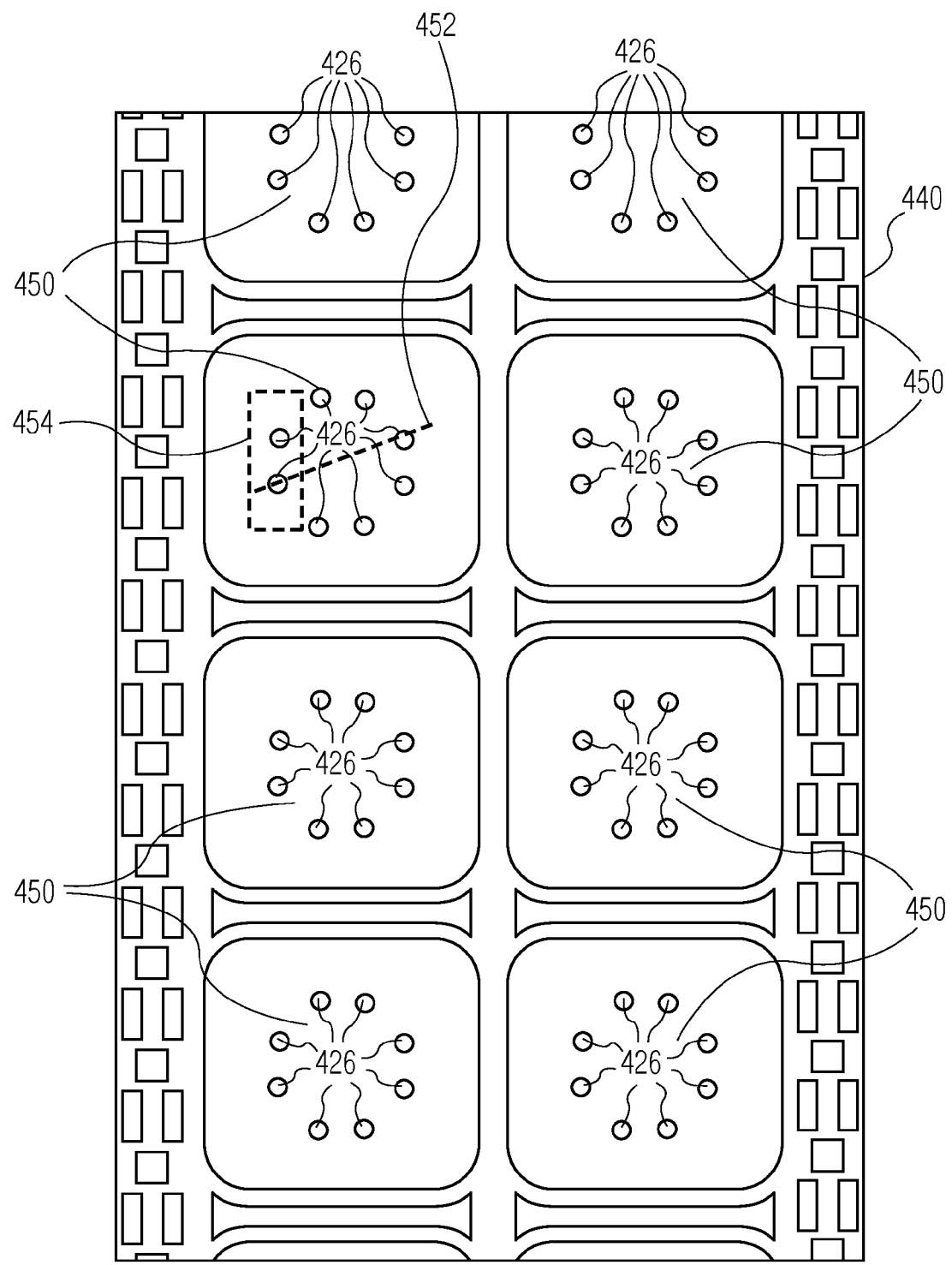
FIG. 4 depicts an embodiment of a single-sided contact tape, which is used to produce a dual-interface contact base structure for the dual-interface IC chip module depicted in FIG. 2.

As illustrated in FIG. 4, the process of manufacturing the dual-interface IC chip module 150 begins by obtaining a single-sided contact tape 440 having multiple single-sided contact base structures 450. In FIG. 4, the single-sided contact tape 440 includes two columns of single-sided contact base structures 450. As shown in FIG. 4, a back-side view of the single-sided contact tape shows the back-side of single-sided contact base structures with bonding holes 426. The single-sided contact tape may be in the form of standalone sheet or in a reel-to-reel format. Although the single-sided contact tape is shown in FIG. 4 as including two columns of single-sided contact base structures, in other embodiment, the single-sided contact tape may include a single column or more than two column of single-sided contact base structures. In addition, although the single-sided contact base structure 450 is shown in FIG. 4 as including certain number of bonding holes, in other embodiment, the single-sided contact base structure may include bond holes in any suitable number. The single-sided contact tape may be obtained by purchasing it from a tape supplier, such as Linxens, Interplex, Kinsus, LG Innotek and Possehl. Alternatively, the single-sided contact tape may be obtained by making it from scratch using a known manufacturing process.

Figure 5:
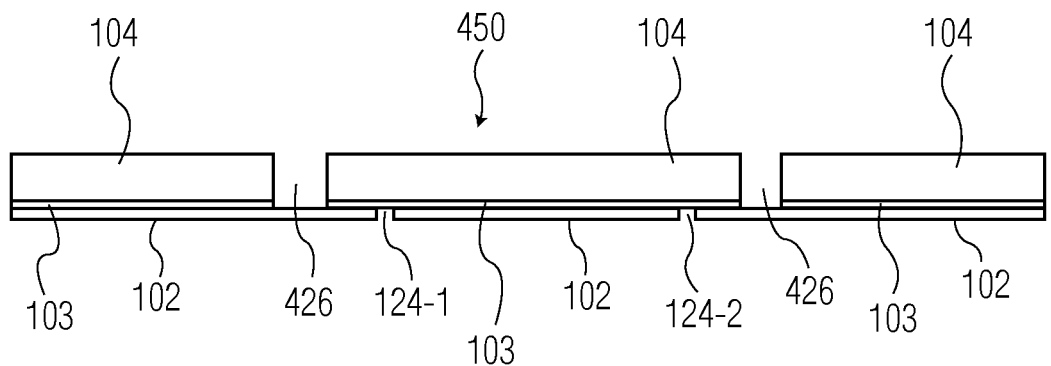
FIG. 5 is a cross-sectional view of a single-sided contact tape depicted in FIG. 4.

FIG. 5 is a cross-sectional view (along a dotted line 452 shown in FIG. 4) of the single-sided contact base structure 450 depicted in FIG. 4. In the embodiment of FIG. 5, the single-sided contact base structure 450 includes the contact layer 102 with the groove lines 124-1, 124-2, the adhesive layer 103 and the substrate 104. The bonding holes 426 are present on the substrate to enable future wire bonding.

Figure 6:
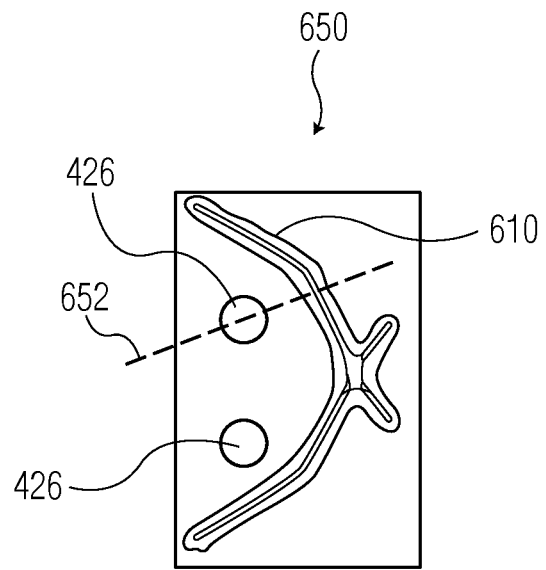
FIG. 6 depicts an embodiment of a single-sided contact tape with adhesive material applied to the tape.

After obtaining the single-sided contact tape 440, the manufacturing process proceeds to the next step in which adhesive is applied to the single-sided contact tape. FIG. 6 depicts a portion 650 of one of the single-sided contact base structures 450 (at an area 454 shown in FIG. 4) of the single-sided contact tape with applied adhesive 610. In FIG. 6, glue or other adhesive material is applied (e.g., dispensed) to one of the single-sided contact base structure of the single-sided contact tape. As shown in FIG. 6, the adhesive is applied to the single-sided contact tape in a shape that partially encircles bond holes 426.

Figure 7:
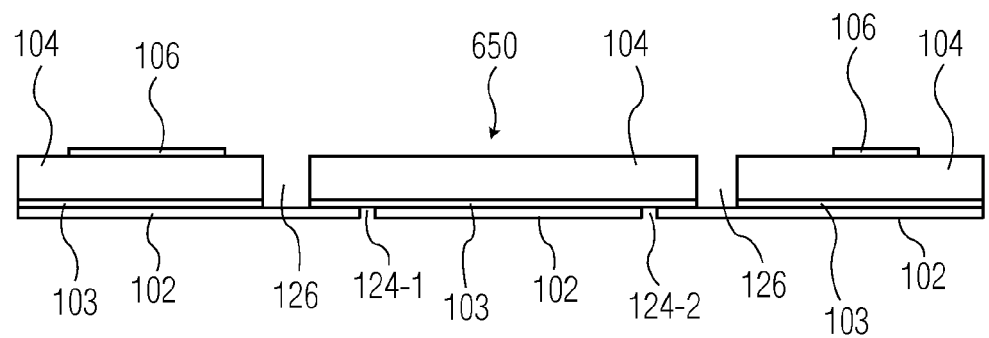
FIG. 7 is a cross-sectional view of the single-sided contact tape depicted in FIG. 6.

FIG. 7 is a cross-sectional view (along a dotted line 652 shown in FIG. 6) of the single-sided contact tape 440, which includes the single-sided contact tape portion 650 depicted in FIG. 6. In FIG. 7, the single-sided contact tape includes the contact layer 102 with the groove lines 124-1, 124-2, the adhesive layer 103, the substrate 104, and the adhesive layer 106, which is formed from the applied adhesive 610.

Figure 8:
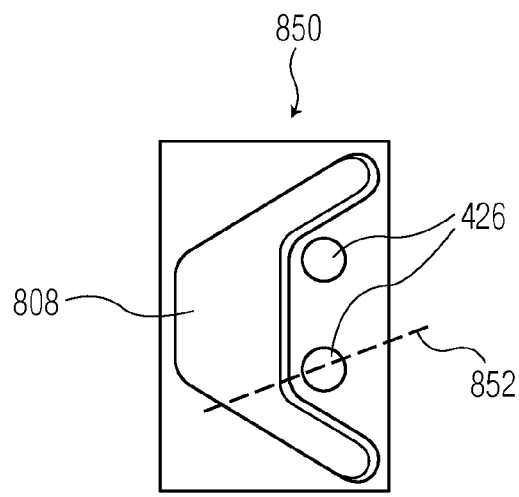
FIG. 8 depicts an embodiment of a dual-interface contact structure having an antenna contact lead.

After the adhesive 610 has been applied to the single-sided contact tape 440, the manufacturing process proceeds to the next step in which antenna contact leads are attached to the single-sided contact tape using the applied adhesive to form a dual-interface contact tape with multiple dual-interface contact structures. The antenna contact leads can be attached to the single-sided contact tape by a pick-and-place process in which one or more antenna contact leads are picked up and placed on the single-sided contact tape. Alternatively, the antenna contact leads can be attached to the single-sided contact tape in a reel-to-reel process in which adhesive is applied to the antenna contact leads on a first reel, which is then applied onto a second reel, i.e., the single-sided contact tape, similar to the process of attaching a sheet of paper labels onto products. FIG. 8 depicts a portion 850 of the dual-interface contact tape with an attached antenna contact lead 808, which is part of a single dual-interface contact structure. The dual-interface contact tape portion 850 corresponds to the single-sided contact tape portion 650 of FIG. 6. In FIG. 8, the antenna contact lead 808 is attached to the single-sided contact tape 440 via the applied adhesive 610 (shown in FIGS. 6 and 7). Alternatively, the antenna contact lead can be attached to the single-sided contact tape by applying an adhesive to the antenna contact lead and then placing antenna contact lead with the adhesive on the single-sided contact tape. The antenna contact lead 808 depicted in FIG. 8 is one possible embodiment of the antenna contact leads 108 depicted in FIG. 1. However, the antenna contact leads 108 depicted in FIG. 1 are not limited to the embodiment shown in FIG. 8.

Figure 9:
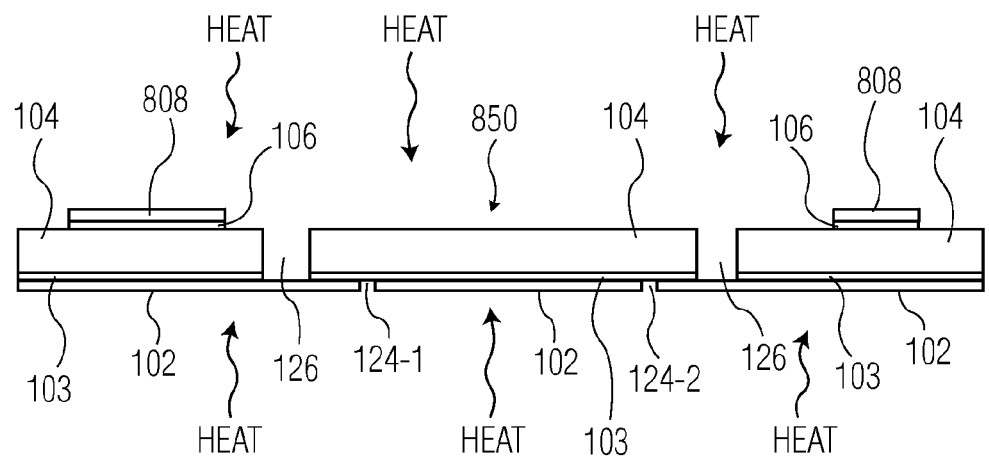
FIG. 9 is a cross-sectional view of the dual-interface contact structure depicted in FIG. 8.

FIG. 9 is a cross-sectional view (along a dotted line 852 shown in FIG. 6) of the dual-interface contact tape, which includes the dual-interface contact structure portion 850 depicted in FIG. 8. In particular, FIG. 9 shows a single dual-interface contact structure formed within the dual-interface contact tape. As shown in FIG. 9, the dual-interface contact structure includes the contact layer 102 with the groove lines 124-1, 124-2, the adhesive layer 103, the substrate 104, the adhesive layer 106, and two antenna contact leads 808. A curing step (e.g., oven curing) may be performed by applying heat to the dual-interface contact structure. Since the dual-interface contact structure of FIG. 9 is made from an inexpensive single-sided contact tape, the cost of the dual-interface contact structure is significantly lower than a comparable conventional dual-interface contact structure made from an expensive double-sided contact tape.

Figure 10:
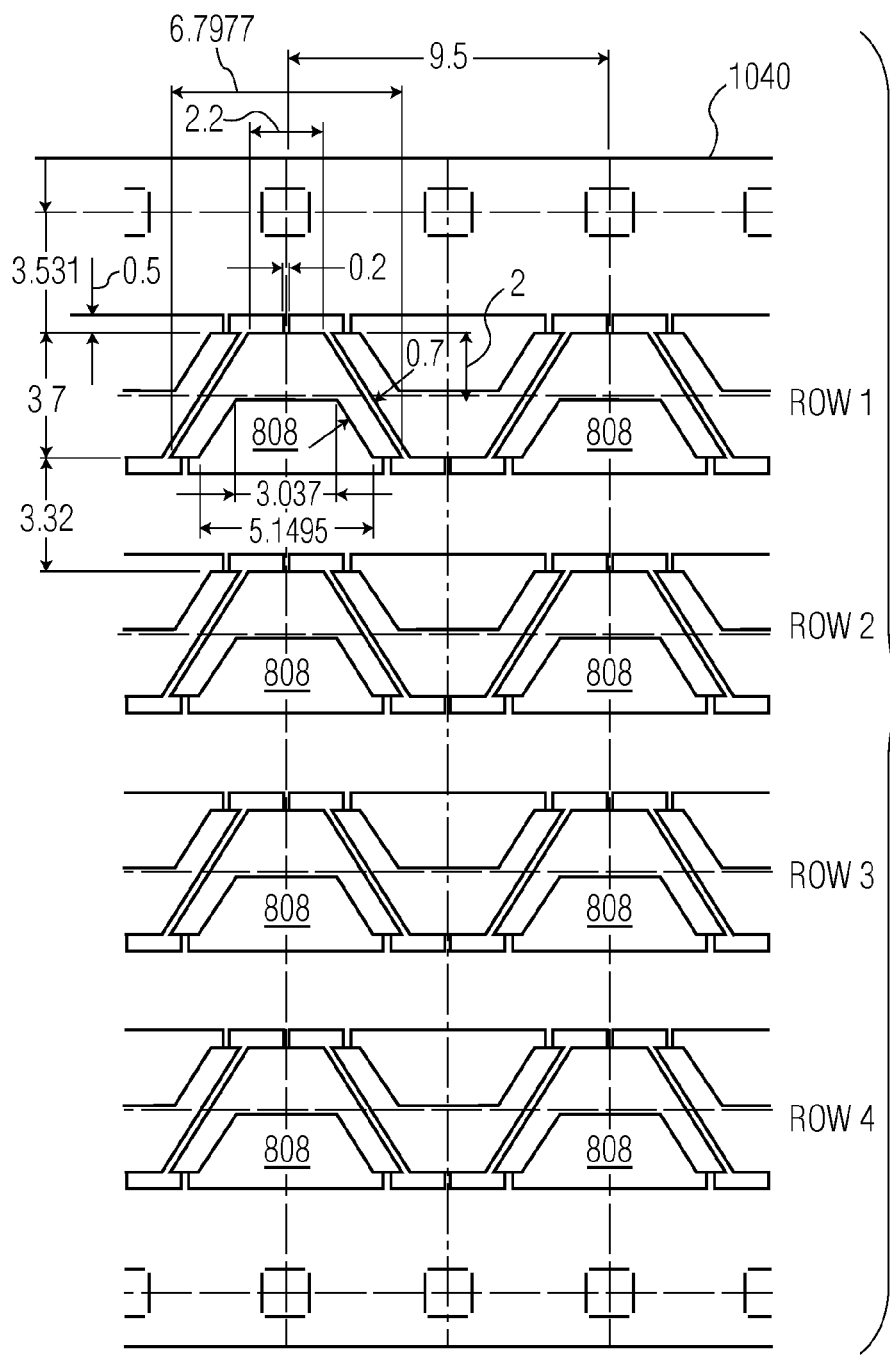
FIG. 10 depicts an embodiment of a sheet of metal material with defined columns of antenna contact leads.

In an embodiment, the antenna contact leads 808 shown in FIGS. 8 and 9 are produced from a sheet of conductive material. As an example, FIG. 10 depicts a sheet of conductive material 1060 that includes four rows of antenna contact leads 808. In the illustrated embodiment, each row includes two A-shaped antenna contact leads. Each A-shaped antenna contact lead has an approximate size of 6.8 millimeter (mm)×3.7 mm. In FIG. 10, specific examples of dimension parameters of the A-shaped antenna contact leads are shown. However, dimension parameters of the antenna contact leads 108 depicted in FIG. 1 are not limited to the embodiment shown in FIG. 10. In the embodiment depicted in FIG. 10, the A-shaped antenna contact leads 808 are punched out of the sheet of conductive material. However, in other embodiments, the A-shaped antenna contact leads are etched or laser cut out of the sheet of conductive material or additively deposited on a substrate by galvano plating or conductive printing.

Figure 11:
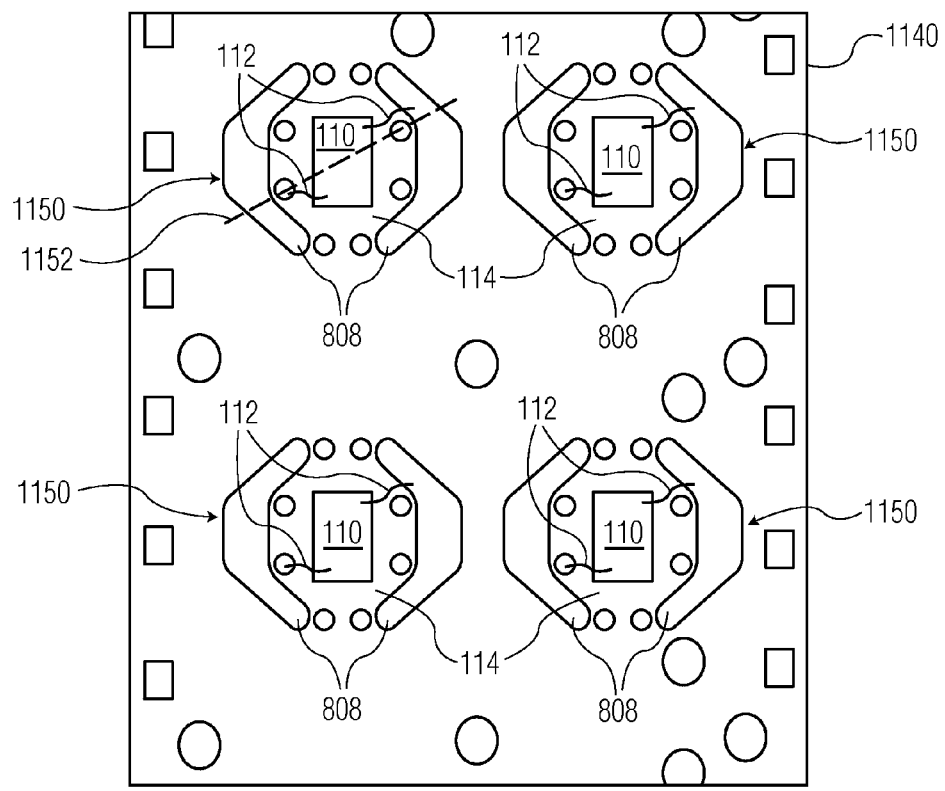
FIG. 11 depicts an embodiment of a reel of dual-interface IC chip modules produced using the dual-interface contact structure depicted in FIGS. 8 and 9.

After the antenna contact leads 808 have been attached to the single-sided contact tape 440 to form the dual-interface contact tape, the manufacturing process proceeds to the next step in which IC chips, bond wires and encapsulations are added to the dual-interface contact structures in the dual-interface contact tape to form dual-interface IC chip modules in the dual-interface contact tape. FIG. 11 depicts an embodiment of a dual-interface contact tape 1140 having multiple dual-interface IC chip modules 1150, which are formed by attaching the IC chips 110 to dual-interface contact structures, attaching the bond wires 112 to the antenna contact leads 808 and to the contact layer 102 (not shown in FIG. 11), and then forming the encapsulations 114 over the IC chips and the bond wires. A separation (e.g., punching or cutting) step can then be performed to separate (e.g., punch out or cut) the dual-interface contact tape 1140 to separate the dual-interface IC chip modules 1150 into individual pieces. For example, a punching process can be performed based on the outline shown in FIG. 4 to separate the dual-interface IC chip modules into individual pieces after a hotmelt tape is applied to the backside of the tape 440. The dual-interface IC chip module 1150 depicted in FIG. 11 is one possible embodiment of the dual-interface IC chip module 150 depicted in FIG. 1. However, the dual-interface IC chip module 150 depicted in FIG. 1 is not limited to the embodiment shown in FIG. 11.

Figure 12:
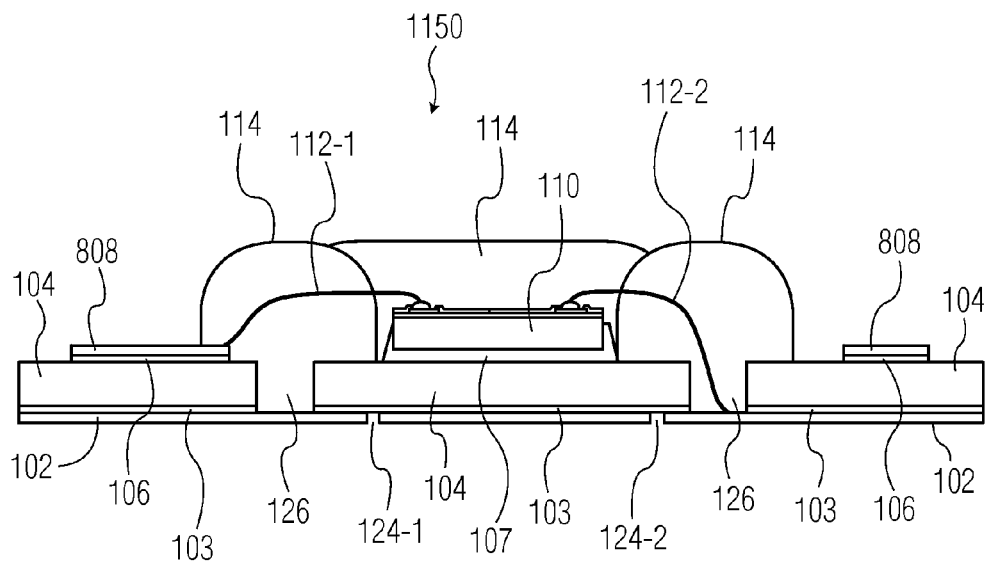
FIG. 12 is a cross-sectional view of a single dual-interface IC chip module depicted in FIG. 11.

FIG. 12 is a cross-sectional view (along a dotted line 1152 shown in FIG. 11) of one of the dual-interface IC chip modules 1150 depicted in FIG. 11. As shown in FIG. 12, the dual-interface IC chip module includes the contact layer 102 with the groove lines 124-1, 124-2, the adhesive layer 103, the substrate 104, the adhesive layer 106, the two antenna contact leads 808, the IC chip 110, the bond wires 112, and the encapsulation 114.

Turning back to FIG. 1, the adhesives 116 are used to attach the dual-interface IC chip module 150, which may be formed in the same manner as the dual-interface IC chip module 1150, to the card body 122. The adhesives may be made of a suitable material, such as film material or gel material (e.g., epoxy, acrylate). In an embodiment, the adhesives are made of a hot melt adhesive material, such as adhesive epoxy or any other thermoplastic material, which becomes viscous with heat.

The electrical connection layer 118 of the dual-interface IC card 100 is used to provide electrical connectivity between the antenna contact leads 108 and the antenna layer 120. The electrical connection layer may be made of any suitable conductive material. For example, the electrical connection layer may be made of a conductive adhesive, a solder or a conductive polymeric material.

The antenna layer 120 of the dual-interface IC card 100 is used to communicate wirelessly with another device (e.g., a card reader). The antenna layer may be made of metal or other suitable material. In some embodiments, the antenna layer is made of a metal coil, such as a copper coil. The antenna layer may be of any suitable shape, including (without being limited to) circular, rectangular and square shapes.

The card body 122 of the dual-interface IC card 100 is used to protect other components of the dual-interface IC card and well as to give shape to the dual-interface IC card. The card body may be made of plastic or other suitable material. In some embodiments, an assembly step can be performed by attaching the antenna layer 120 and the card body to the dual-interface IC chip module 150 to produce the dual-interface IC card.

Figure 13:
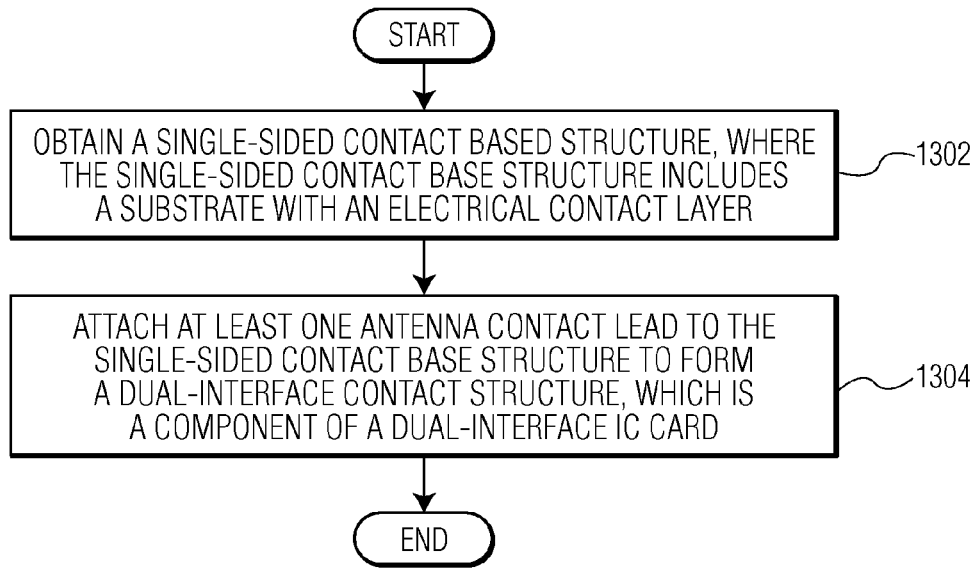
FIG. 13 is a process flow diagram of a method for manufacturing a dual-interface IC card component in accordance with an embodiment of the invention.

FIG. 13 is a process flow diagram of a method for manufacturing a dual-interface IC card component in accordance with an embodiment of the invention. At block 1302, a single-sided contact base structure is obtained, where the single-sided contact base structure includes a substrate with an electrical contact layer. In some embodiments, the single-sided contact base structure is part of a single-sided contact tape, such as the single-sided contact tape 440 shown in FIGS. 4 and 5. At block 1304, at least one antenna contact lead is attached to the single-sided contact base structure to form a dual-interface contact structure, which is a component of a dual-interface IC chip module of a dual-interface IC card. In some embodiments, the dual-interface contact structure is part of a dual-interface contact tape, such as the dual-interface contact tape shown in FIGS. 8 and 9.

Figure 14:
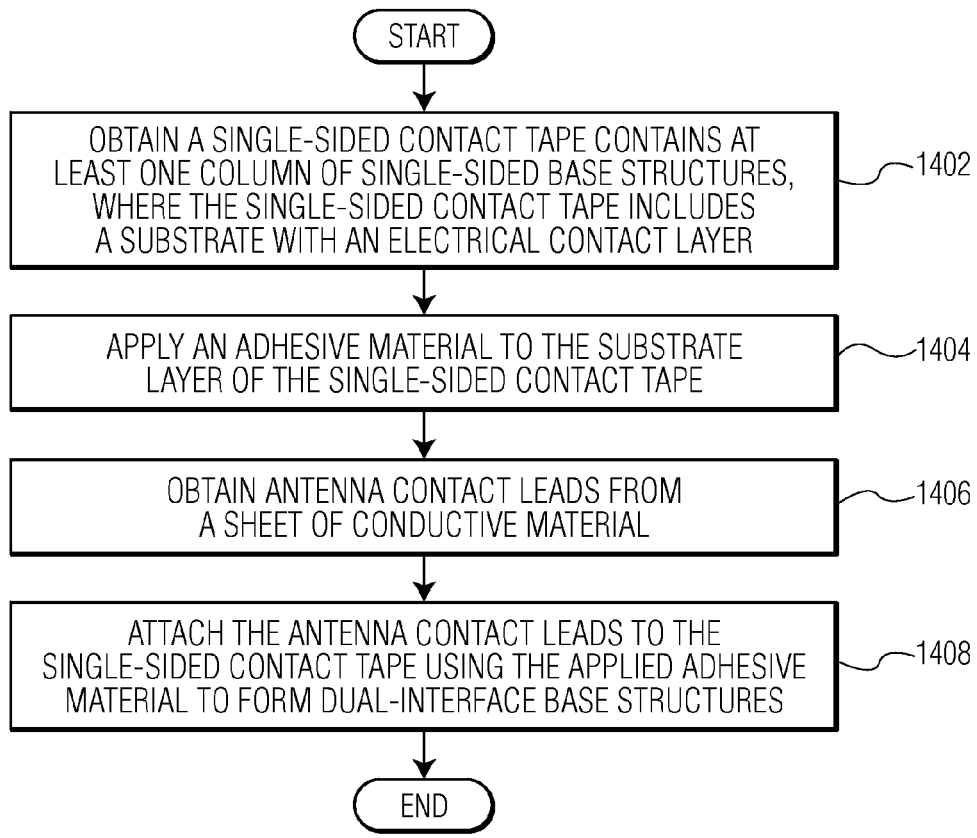
FIG. 14 is a process flow diagram of a method for manufacturing a dual-interface IC card component in accordance with another embodiment of the invention.

FIG. 14 is a process flow diagram of a method for manufacturing a dual-interface IC card component in accordance with an embodiment of the invention. At block 1402, a single-sided contact tape that contains at least one column of single-sided base structure is obtained. The single-sided contact tape includes a substrate with an electrical contact layer. At block 1404, an adhesive material is applied to the substrate of the single-sided contact tape. At block 1406, antenna contact leads are obtained from a sheet of conductive material. At block 1408, the antenna contact leads are attached to the single-sided contact tape using the applied adhesive material to form dual-interface base structures.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for manufacturing a dual-interface integrated circuit (IC) card component, the method comprising:
obtaining a single-sided contact base structure, wherein the single-sided contact base structure comprises a substrate with an electrical contact layer; and
attaching at least one A-shaped antenna contact lead to the single-sided contact base structure to form a dual-interface contact structure, which is a component of a dual-interface IC card, wherein the at least one A-shaped antenna contact lead is removed out of a sheet of conductive material.

2. The method of claim 1, wherein attaching the at least one antenna contact lead to the single-sided contact base structure comprises:
picking up an antenna contact lead; and
placing the antenna contact lead on the single-sided contact base structure to attach the antenna contact lead to the single-sided contact base structure.

3. The method of claim 1, wherein attaching the at least one antenna contact lead to the single-sided contact base structure comprises:
applying an adhesive material to the substrate of the single-sided contact base structure; and
placing an antenna contact lead on the applied adhesive material to attach the antenna contact lead to the single-sided contact base structure.

4. The method of claim 3, wherein applying the adhesive material to the substrate comprises dispensing glue onto the substrate.

5. The method of claim 3, further comprising curing the adhesive material.

6. The method of claim 1, wherein attaching the at least one antenna contact lead to the single-sided contact base structure comprises:
applying an adhesive material to an antenna contact lead; and
placing the antenna contact lead with the applied adhesive material on the single-sided contact base structure to attach the antenna contact lead to the single-sided contact base structure.

7. The method of claim 1, wherein the contact layer is attached to a first side of the substrate, and wherein the at least one antenna contact lead is attached to a second, opposite, side of the substrate.

8. The method of claim 1, further comprising obtaining the at least one antenna contact lead by punching, etching or laser cutting the sheet of conductive material.

9. The method of claim 1, wherein the at least one antenna contact lead is applied to the single-sided contact base structure in a reel-to-reel process.

10. The method of claim 1, wherein the at least one antenna contact lead is crimped or has a spring like feature.

11. The method of claim 1, wherein obtaining the single-sided contact base structure comprises obtaining a single-sided contact tape.

12. The method of claim 1, wherein the at least one antenna contact lead is electrically connected to an antenna located on the substrate.

13. The method of claim 1, further comprising attaching an IC chip, bond wires and an encapsulation to the dual-interface contact structure to produce a dual-interface IC chip module.

14. A method for manufacturing a dual-interface integrated circuit (IC) card component, the method comprising:

obtaining a single-sided contact tape that contains at least one column of single-sided base structures, wherein the single-sided contact tape comprises a substrate with an electrical contact layer;

applying an adhesive material to the substrate of the single-sided contact tape;

removing a plurality of A-shaped antenna contact leads out of a sheet of conductive material; and attaching the A-shaped antenna contact leads to the single-sided contact tape using the applied adhesive material to form dual-interface contact structures.

15. The method of claim 14, wherein obtaining the plurality of antenna contact leads comprises punching the antenna contact leads out of a sheet of conductive material.

16. The method of claim 14, further comprising:

attaching an IC chip, bond wires and an encapsulation to each of the dual-interface contact structures to produce dual-interface IC chip modules.

17. The method of claim 14, wherein applying the adhesive material to the substrate comprises dispensing glue onto the substrate.

18. The method of claim 14, further comprising curing the adhesive material.

19. A dual-interface integrated circuit (IC) card component, the dual-interface IC card component comprising:

a substrate;

an electrical contact layer attached to a first side of the substrate, the electrical contact layer comprising a contact plate and a plurality of grooves; and at least one A-shaped antenna contact lead glued to a second, opposite, side of the substrate, wherein the at least one A-shaped antenna contact lead is removed out of a sheet of conductive material.

20. The dual-interface IC card component of claim 19, further comprising:

an IC chip attached to the substrate;

bond wires electrically connected to the IC chip, the electrical contact layer and the at least one antenna contact lead; and an encapsulation over the IC chip.

* * * * *